United States Patent
Yamauchi

[19]

[11] Patent Number: 6,105,156
[45] Date of Patent: Aug. 15, 2000

[54] LSI TESTER FOR USE IN LSI FAULT ANALYSIS

[75] Inventor: Hisashi Yamauchi, Tokyo, Japan

[73] Assignee: NEC Corporation, Tokyo, Japan

[21] Appl. No.: 09/053,479

[22] Filed: Apr. 1, 1998

[51] Int. Cl.[7] .................................................. G01R 3/28
[52] U.S. Cl. .......................................... 714/738; 714/726
[58] Field of Search ................................... 714/718–721, 714/724, 735–738, 819–822, 824

[56] References Cited

U.S. PATENT DOCUMENTS

| | | | |
|---|---|---|---|
| 3,803,560 | 4/1974 | DeVoy et al. ................................. | 714/5 |
| 4,293,950 | 10/1981 | Shimizu et al. ......................... | 714/743 |
| 4,375,664 | 3/1983 | Kim .......................................... | 714/52 |
| 4,556,840 | 12/1985 | Russell ..................................... | 714/738 |
| 4,672,307 | 6/1987 | Breuer et al. ............................ | 714/738 |
| 4,736,159 | 4/1988 | Shiragasawa et al. .................. | 324/752 |
| 5,293,383 | 3/1994 | Knefel ..................................... | 714/703 |
| 5,329,471 | 7/1994 | Swoboda et al. ....................... | 364/578 |
| 5,475,692 | 12/1995 | Hatano et al. ........................... | 714/719 |
| 5,544,173 | 8/1996 | Meltzer .................................... | 714/726 |
| 5,550,841 | 8/1996 | O'Brien ................................... | 714/724 |
| 5,661,763 | 8/1997 | Sands ....................................... | 375/368 |
| 5,673,272 | 9/1997 | Proskauer et al. ...................... | 714/724 |
| 5,703,788 | 12/1997 | Shei et al. ............................... | 364/488 |
| 5,726,996 | 3/1998 | Chakradhar et al. ................... | 714/724 |
| 5,805,792 | 9/1998 | Swoboda et al. .................. | 395/183.04 |
| 5,815,512 | 9/1998 | Osawa et al. ........................... | 714/726 |
| 5,889,789 | 3/1999 | Sanada .................................... | 714/745 |

OTHER PUBLICATIONS

A BIST Scheme using Microprogram ROM for Large Capacity Memories, Koike, et al., IEEE, 1990.
An Automatic Test Program Generator, Ogata, et al., IEEE, Sep.1991.
A Defect–Tolerant DRAM employing a Hierarchical Redundancy Scheme, Built–In Self–Test and Self–Reconfiguration, Niggemeyer, et al., IEEE, Jul. 1997.
High Precision Testing Method of Mixed Signal Device, Watanabe, et al., IEEE, Mar. 1994.
De, et al. Failure Analysis for Full–Scan Circuits, IEEE, 1995.
Adachi, et al., Software Environment for 500–MHz VLSI Test System, IEEE, 1988.
Hwang, et al., Fault Analysis and Automatic Test Pattern Generation for Break Faults in Programmable Logic Arrays, IEEE, 1996.
Lee, et al., Architectural Level Test Generation for Microprocessors, IEEE, 1994.
Nakamura, et al., Novel Image–Based LSI Diagnostic Method Using E–Beam without CAD Database, IEEE, 1992.
Itazaki, et al., Automatic Fault Locator Using E–Beam and LSI Testers, IEEE, 1993.
Sumitomo, et al., Open Fault Detection Method for CMOS–LSI by Supplying Pulsed Voltage Signal to VDD and GND Lines, IEEE, 1997.
Takahashi, et al., Fault Simulation for Multiple Faults by Boolean Function Manipulation, IEEE, 1994.

*Primary Examiner*—Albert De Cady
*Assistant Examiner*—Guy Lamarre

[57] ABSTRACT

An LSI tester having a path analysis means for tracing a series of connections reversely along a designated signal flow path from one of flip-flops of DUT (device under test) at which flip-flop an inconsistency in pattern value has been detected as a consistency detection point by an output pattern comparator, based on circuit information in DUT, and for identifying firstly reachable flip-flops or external terminals from the inconsistency detection point as arrival points. And a sequence-pattern-inverting means sequentially inverts at least partly the values of successive test patterns one at a time with respect to each of the arrival points. The fault position in DUT is narrowed down from the arrival points simply in a shorter time.

20 Claims, 5 Drawing Sheets

FIG.4

| PATTERN No. \ TERMINAL NAME (OR F/F NAME) | I1 | I2 | F1 | F2 | F3 | F4 | F5 | F6 |
|---|---|---|---|---|---|---|---|---|
| 0 | 1 | 0 | 1 | 1 | 0 | 0 | 0 | 0 |
| 1 | 0* | 0 | 1 | 1 | 0 | 0 | 0 | 0 |
| 2 | 1 | 0 | 0* | 1 | 0 | 0 | 0 | 0 |
| 3 | 1 | 0 | 1 | 0* | 0 | 0 | 0 | 0 |
| 4 | 1 | 0 | 1 | 1 | 0 | 1* | 0 | 0 |
| 5 | 0* | 0 | 0* | 1 | 0 | 0 | 0 | 0 |
| 6 | 0* | 0 | 1 | 0* | 0 | 0 | 0 | 0 |
| 7 | 0* | 0 | 1 | 1 | 0 | 1* | 0 | 0 |
| 8 | 1 | 0 | 0* | 0* | 0 | 0 | 0 | 0 |
| 9 | 1 | 0 | 0* | 1 | 0 | 1* | 0 | 0 |
| 10 | 1 | 0 | 1 | 0* | 0 | 1* | 0 | 0 |
| 11 | 0* | 0 | 0* | 0* | 0 | 0 | 0 | 0 |
| 12 | 0* | 0 | 1 | 0* | 0 | 1* | 0 | 0 |
| 13 | 0* | 0 | 0* | 1 | 0 | 1* | 0 | 0 |
| 14 | 1 | 0 | 0* | 0* | 0 | 1* | 0 | 0 |
| 15 | 0* | 0 | 0* | 0* | 0 | 1* | 0 | 0 |

N.B. : THE INVERTED VALUE IS SHOWN WITH THE SYMBOL *.

FIG.5

| PATTERN No. | I1 | I2 | F1 | F2 | F3 | F4 | F5 | F6 |
|---|---|---|---|---|---|---|---|---|
| 0 | 1 | 0 | 1 | 1 | 0 | 0 | 0 | 0 |
| 1 | 0* | 0 | 0* | 0* | 0 | 0 | 0 | 0 |
| 2 | 1 | 0 | 0* | 0* | 0 | 0 | 0 | 0 |
| 3 | 0* | 0 | 1 | 0* | 0 | 0 | 0 | 0 |
| 4 | 1 | 0 | 1 | 0* | 0 | 0* | 0 | 0 |
| 5 | 0* | 0 | 0* | 1 | 0 | 0 | 0 | 0 |
| 6 | 1 | 0 | 0* | 1 | 0 | 0 | 0 | 0 |
| 7 | 0* | 0 | 1 | 1 | 0 | 0 | 0 | 0 |
| 8 | 0* | 0 | 0* | 0* | 0 | 1* | 0 | 0 |
| 9 | 1 | 0 | 0* | 0* | 0 | 1* | 0 | 0 |
| 10 | 0* | 0 | 1 | 0* | 0 | 1* | 0 | 0 |
| 11 | 1 | 0 | 1 | 0* | 0 | 1* | 0 | 0 |
| 12 | 0* | 0 | 0* | 1 | 0 | 1* | 0 | 0 |
| 13 | 1 | 0 | 0* | 1 | 0 | 1* | 0 | 0 |
| 14 | 0* | 0 | 1 | 1 | 0 | 1* | 0 | 0 |
| 15 | 1 | 0 | 1 | 1 | 0 | 1* | 0 | 0 |

N.B. : THE INVERTED VALUE IS SHOWN WITH THE SYMBOL *.

LSI TESTER FOR USE IN LSI FAULT ANALYSIS

BACKGROUND OF THE INVENTION

1. Field of the Invention

The present invention relates to an LSI tester and more particularly to an LSI tester for use in analyzing a possible defect, fault or the like of an LSI(large-scale integrated circuit).

2. Description of the Related Art

In analyzing a possible fault of LSI, particularly in specifying the fault position in the LSI, it has been a common practice to carry out a fault simulation on a computer or to use an EB (electron beam) tester.

Attempts have been made to locate the fault position more precisely in a simpler manner. For example, Japanese Patent Laid-Open Publication No. Hei5-341005 discloses a fault detection system that carries out fan-in tracing from the individual error observation points by testers and divides whole of the fault circuit into groups in terms of the error observation points based on information about the error observation points. In this fault detection system, a fault is assumed to perform fault simulation by an error probability calculation means. An error probability is calculated from the number of times when the individual error observation points of the particular circuit group in which this assumed fault exists have observed as error using the testers and also from the number of times when the fault detection has been made at the error observation points in the fault simulation. The result of this calculation is outputted as an error cause.

Regarding the conventional fault analysis using the EB tester, since the EB tester itself requires a special mechanism which is usually expensive, it is not suitable for use in a fault analysis of a great number of LSIs. Further, an EB tester cannot identify faults located in a deeper layer in a multilayer structure.

Yet in a further conventional fault analysis by a multilayer-structure fault simulation on a computer, it usually takes a huge amount of computing time to locate the fault position, so this conventional analysis can hardly be applied to all types of LSIs. Another problem with this conventional analysis is that the object of analyzing is limited to the so-called stuck-at fault in which the fault mode would be fixed in some logical value.

SUMMARY OF THE INVENTION

It is therefore an object of the present invention to provide an LSI tester, for use in a fault analysis, which facilitates locating a possible defect, fault or the like (hereinafter called the fault) in an LSI.

According to the present invention, the above object is accomplished by an LSI tester for use in analyzing a possible fault of an LSI, which includes a plurality of flip-flops (or external terminals) interconnected via a plurality of wirings, comprising: a test pattern generator for generating successive test patterns to be inputted to the LSI each as an input pattern value such as to flow in a designated signal flow path passing through a designated series of the connections and also for generating successive reference patterns each having an expected output pattern value which is equivalent with its corresponding actual output pattern value to be outputted from the LSI when all of the flip-flops (or external terminals) in the designated signal flow path are normal in function; an output pattern comparator for comparing the output pattern value from the LSI with the expected output pattern value for each and every one of the successive test patterns; path analysis means for tracing the predetermined series of the connections reversely along the designated signal flow path from one of the flip-flops where an inconsistency in pattern value has been detected by the output pattern comparator as an inconsistency detection point, based on circuit information of the LSI, and for identifying of the flip-flops (or external terminals) in the designated signal flow path which are firstly reachable flip-flops (or external terminals) from the inconsistency detection point as an arrival point; and sequential-pattern-inverting means for sequentially inverting at least partly the pattern values of the successive test patterns one at a time with respect to the one flip-flop (or external terminal) identified as the arrival point.

With the LSI tester of the present invention, by the action of the path-tracing means, it is possible to identify an input terminal or flip-flop that can reach an output terminal or flip-flop where an inconsistency output has been detected. And by the action of the pattern-changing means, it is possible to restrict the involved input terminals or flip-flops to a specified group. Now if a succession of patterns are generated for only these specified input terminals or flip-flops, it is possible to facilitate locating the LSI fault.

Further, the LSI tester of the invention selectively adopts a method of comparing the same value of the output terminal as the conventional LSI tester in logical level or a method of measuring a current and comparing the measured current with the ordinary value. Therefore, this LSI tester, unlike the EB tester, does not require any special mechanism utilizing electron beams.

BRIEF DESCRIPTION OF THE DRAWINGS

The above and other objects, advantages and features of the present invention will be more apparent from the following description taken in conjunction with the accompanying drawings in which:

FIG. 4 is a table showing examples of created inspection patterns to be applied to the LSI tester of the invention; and FIG. 5 is a table similar to FIG. 4, but showing additional examples of created inspection patterns to be applied to the LSI tester of the invention.

DETAILED DESCRIPTION OF PREFERRED EMBODIMENTS

The principles of the present invention are particularly useful when applied to an LSI tester, various preferred embodiments of which will now be described in detail with reference to the accompanying drawings.

Figure 1:
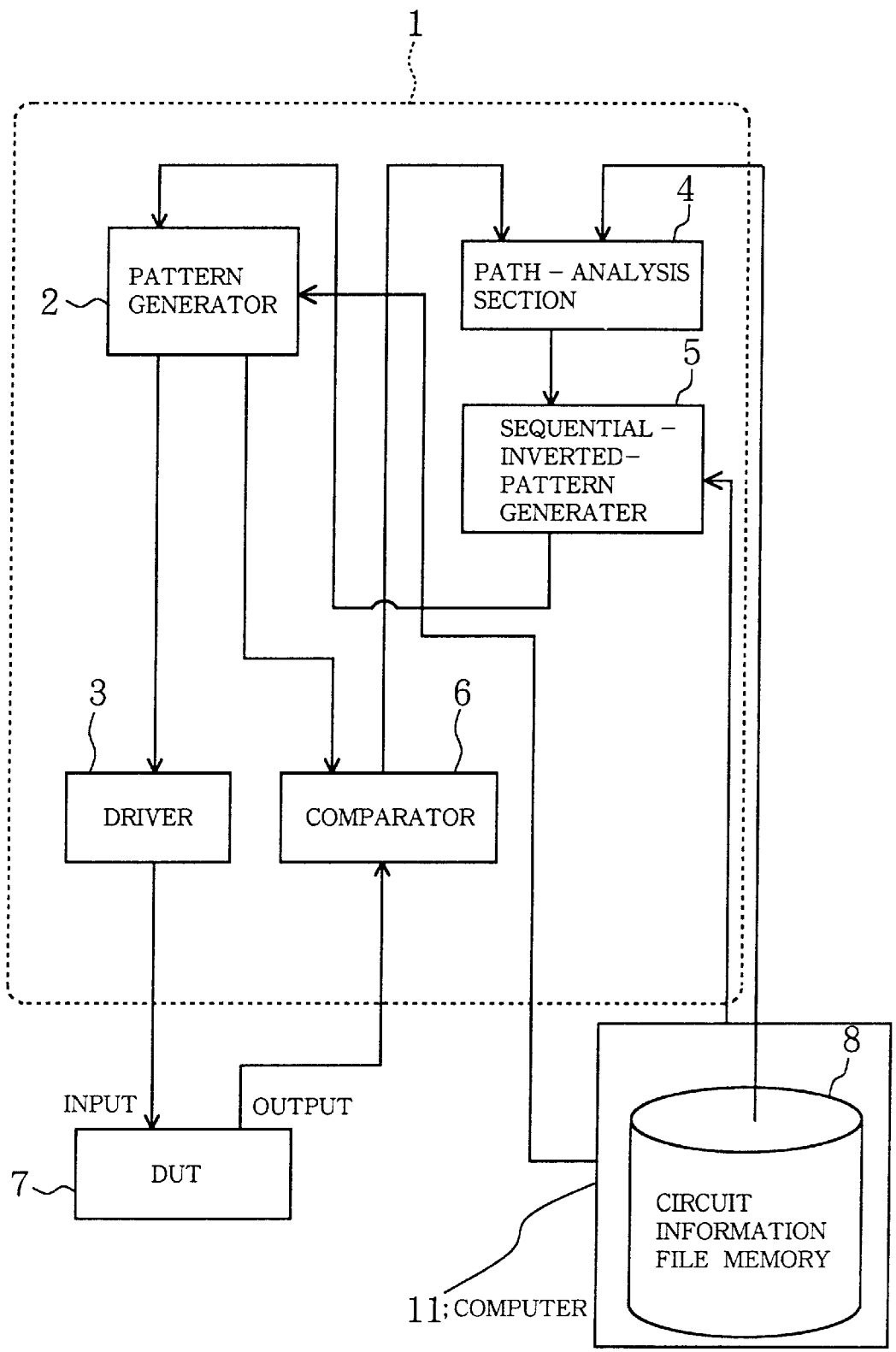
FIG. 1 is a block diagram showing an LSI tester, for use in a fault analysis, according to a first embodiment of the invention.

FIG. 1 is a block diagram showing an LSI tester, for use in analyzing a possible fault in an LSI to be tested (hereinafter called the DUT, device under test), according to a first embodiment of the invention.

The LSI tester 1 generally comprises a test pattern generator 2, which has a built-in scan path handling, and an output pattern comparator 6. The LSI tester 1 further comprises a path analysis section (path analysis means) 4 for tracing a series of connections reversely along a signal flow path from one of flip-flops or external terminals where a possible inconsistency in pattern value (described below) has been detected, based on circuit information of the DUT 7, and for identifying of all of the flip-flops or external terminals in the designated signal flow path which are firstly reachable flip-flops or external terminals from the inconsistency detection point, and a sequential-inverted-pattern generator (sequential-pattern-inverting means) 5 for sequentially inverting at least in part said values of said successive test patterns one at a time for each and every of the successive test patterns.

Reference number 7 designates an LSI to be tested (hereinafter also called the DUT, i.e. device under test); and 8, a circuit information file memory in which circuit information is stored. In the circuit information file memory 8, usually a net list with or without block information is stored.

The pattern generator 2 generates successive test patterns, usually taking out a signal pattern to be added to the DUT 7, generating a value to be given to each external terminal and giving the value as an electrical signal to the DUT 7 via a driver 3. The output signal of the DUT 7 contains the value of an individual scan flip-flop and is compared with a reference value (of a normal LSI circuit) by the output pattern comparator 6. At that time, if a difference is found, it means that a defect or fault has occurred in the DUT 7.

To specify such a fault position, the LSI tester of this embodiment operates as follows: The LSI tester 1 identifies the external terminal or flip-flop at which an inconsistency has been detected in terms of the pattern difference by the comparator 6. This position is hereinafter called "the inconsistency detection point". The path-analysis section 4 traces the connections of the DUT 7 reversely along the signal flow path from the inconsistency detection point using data from the circuit information file memory 8 in which the circuit information is stored, thereby identifying the involved flip-flops or external terminals at which the tracing arrives. These positions are hereinafter called "the arrival points". Based on the information about these arrival points, the sequential-inverting-pattern generator 5 generates an inverting pattern to sequentially invert the successive patterns of the arrival points. The individual inverting pattern is then given to the DUT 7 via the pattern generator 2 and the driver 3. The output of the DUT 7 is compared with the successive patterns in the comparator 6 where an output value with respect to each pattern is observed. Accordingly, from the file memory 8 in which variation of this output value and the circuit information are stored, the LSI tester 1 can exactly locate or point a possible fault position where a fault presumably has occurred.

The respective functions of the path analysis section 4, the test pattern generator 2 and the sequential-inverting-pattern generator 5 are controllably executed according to a dedicated program installed in a computer 11. The circuit information file memory 8 is a built-in part of the computer 11. Alternatively the circuit information file memory 8 may be an external storage to be controlled by the computer 11.

Figure 2:
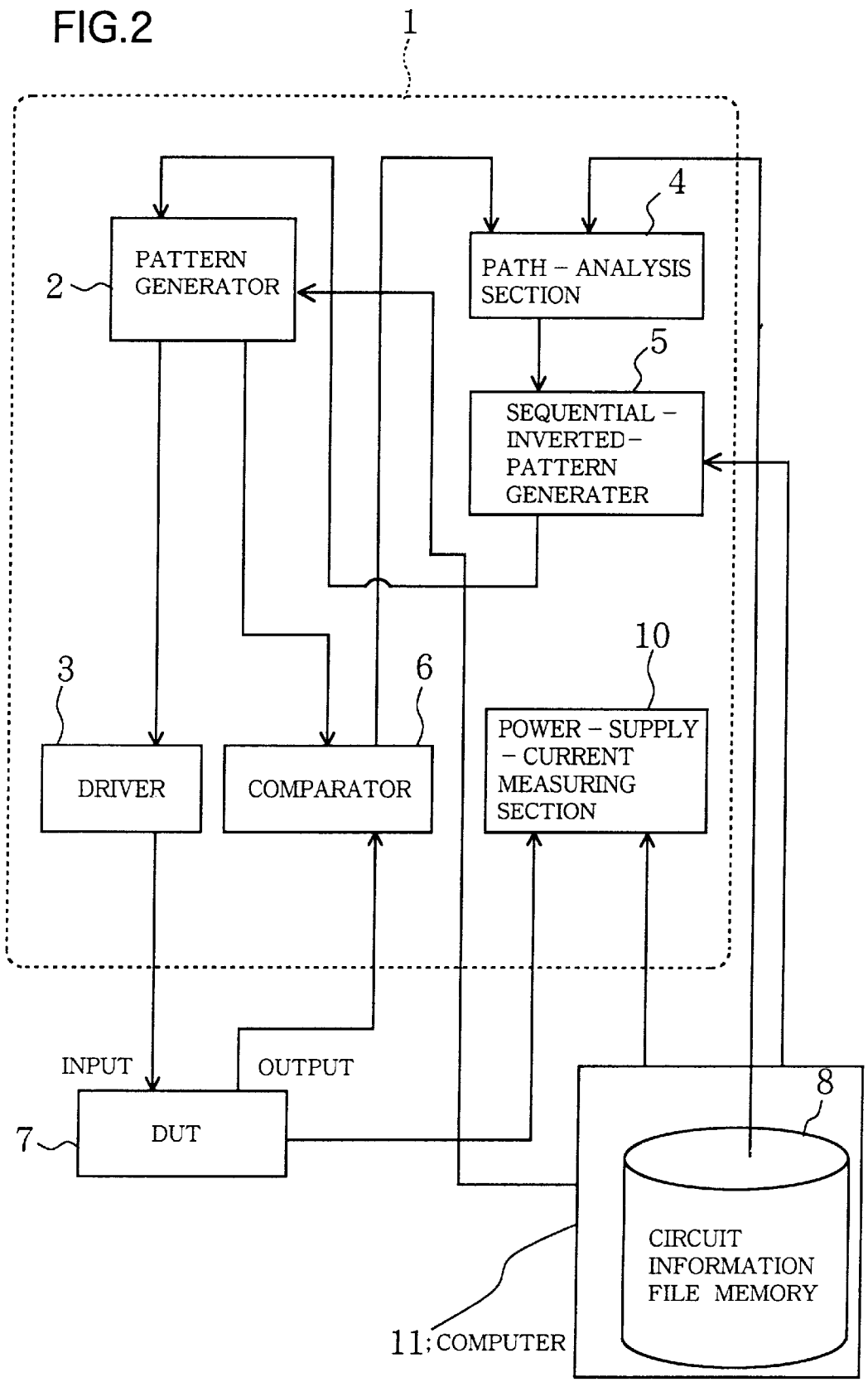
FIG. 2 a block diagram similar to FIG. 1, but showing a modified LSI tester according to a second embodiment.

FIG. 2 shows a modified LSI tester according to a second embodiment of the invention. Parts or elements similar to those of FIG. 1 are designated by the same reference numbers in FIG. 2.

The LSI tester 1 of the second embodiment includes, in addition to the components of the first embodiment, a power-supply-current measuring section (power-supply-current measuring means) 10 for measuring a power supply operating current when the value of a pattern is changed in sequence. The function of the power-supply-current-measuring section 10 is executed by a program installed in a computer 11.

Based on an input test pattern, the pattern generator 2 usually takes out a single pattern to be added to the DUT 7, generates a value to be given to each external terminal and gives the value as an electrical signal to the DUT 7 via a driver 3. The output signal of the DUT 7 contains also the value of an individual scan flip-flop and is compared with a reference value by the comparator 6. At that time, if a difference is found, it means that a defect or fault has occurred anywhere in the DUT 7.

The path-analysis section 4 traces the connections of the DUT 7 reversely along the signal flow path from the inconsistency detection point using data from the circuit information file memory 8 in which the circuit information is stored, thereby identifying the arrival points. Based on the information on these arrival points, the sequential-inverting-pattern generator 5 generates an inverting pattern to sequentially invert the successive patterns of the arrival points. The inverting pattern is then given to the DUT 7 via the pattern generator 2 and the driver 3. The output of the LSI 7 is compared with the successive patterns in the comparator 6 where an output value with respect to each pattern is observed. In the meantime, using the power-supply-current measuring section 10, it is observed whether or not an abnormal current flows in the DUT 7.

The respective functions of the path analysis section 4, the test pattern generator 2 and the sequential-inverting-pattern generator 5 are controllably executed according to a dedicated program installed in a computer 11. The circuit information file memory 8 is a built-in part of the computer 11. Alternatively the circuit information file memory 8 may be an external storage to be controlled by the computer 11.

Regarding a complementary metal oxide semiconductor LSI (CMOSLSI) in particular, based on the information on whether or not an abnormal current flows with respect to each pattern, it is possible to exactly locate or point a possible fault position where a fault has presumably occurred.

The procedure in which a fault of DUT 7 is analyzed will now be described with reference to FIGS. 3 to 5.

Figure 3:
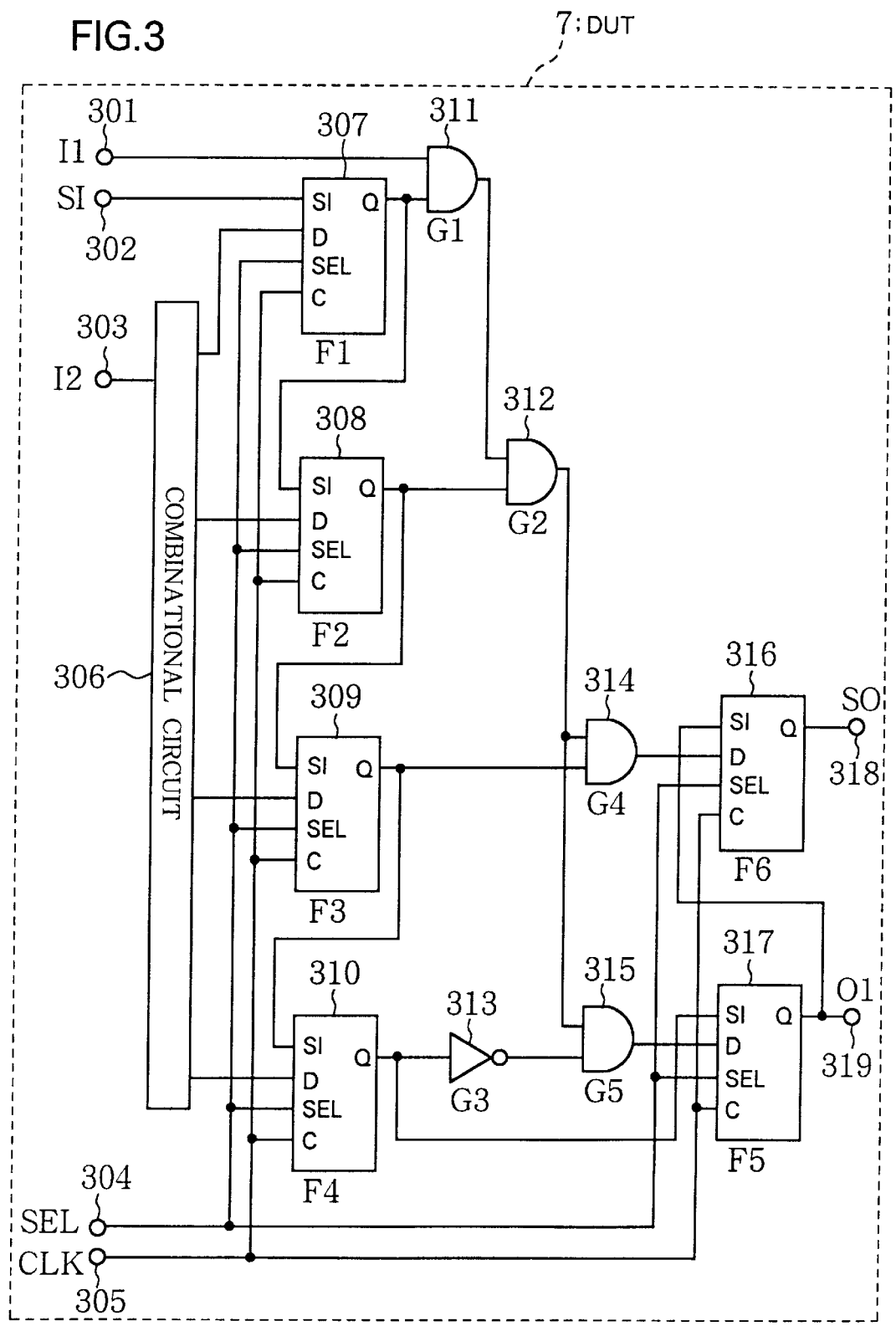
FIG. 3 is a circuit diagram showing an LSI circuit to be tested by the LSI tester of the invention.

FIG. 3 shows an LSI circuit to be analyzed by the LSI tester 1. In FIG. 3, of various input terminals, i.e., an I1 input terminal as an ordinary data input terminal (ordinary input terminal) 301, an SI input terminal (scan data input terminal) 302, an I2 input terminal as an ordinary data input terminal (ordinary input terminal)303, an SEL input terminal (scan mode control terminal) 304 and a CLK input terminal (clock terminal) 305, especially the SI input terminal 302 is an input terminal from which scan data is to be inputted, and the SEL input terminal 304 is a mode terminal at which the mode of a scan path register is to be switched between a test mode and a shift mode. And the I2 input terminal 303 is connected to a combinational circuit 306.

Alphabetic characters SI, D, SEL, C and Q shown in each of an F1 scan flip-flop 307, an F2 scan flip-flop 308, F3 scan flip-flop 309, an F4 scan flip-flop 310, an F6 scan flip-flop 316 and an F5 scan flip-flop 317 stand for a scan input, a data input, a selection input of the scan input and data input, a clock input and a data output, respectively. Alphanumeric characters G1-311, G2-312, G4-314 and G5-315 designate AND gates, and G3-313 designates an inverter. SO-318 designates an output terminal (scan data output terminal) for outputting scan data, and O1-319 designates an output terminal (ordinary output terminal).

Now assuming that an inconsistency in value with a normal LSI circuit has been detected from the F5 scan flip-flop 317, external terminals or flip-flops which can reach this F5 scan flip-flop 317 are to be identified by the path-analysis section 4. The external terminals or flip-flops are the I1 input terminal 301, the F1 scan flip-flop 307, the F2 scan flip-flop 308 and the F4 scan flip-flop 310. And the sequential-inverting-pattern generator 5 generates a pattern whose partial or whole value is inverted only with respect to the value of each of these terminals or flip-flops.

FIGS. 4 and 5 show examples of patterns to be generated from the sequential-inverting-pattern generator 5 when the arrival points have been identified, from the output signal of the path-analysis section 4, as the I1 input terminal 301, the F1 scan flip-flop 307, the F2 scan flip-flop 308 and the F4 scan flip-flop 310.

In FIG. 4, columns (vertical) designated by 401 are terminal names (or scan flip-flop names) identifying the scan path flip-flops and the ordinary input terminals other than the scan path control terminals. The values of the scan path flip-flops represent values to be inputted in serial from the scan path data input terminals. Rows (horizontal) designated by 402 are pattern numbers, and 403 designates patterns of input terminals or flip-flops to be given one for each pattern number.

Likewise, in FIG. 5, columns designated by 501 are terminal names identifying the scan path flip-flops and the ordinary input terminals other than the scan path control input terminals. The values of the scan path flip-flops represent values to be inputted in serial from the scan path data input terminals. Rows (horizontal) designated by 502 are pattern numbers, and 503 designates patterns of input terminals or flip-flops to be given one for each pattern number.

Turning back to FIG. 4, the 0-th pattern is a pattern that an inconsistency was found, namely, a pattern that none of values of the arrival points was inverted. The 1st to 4th patterns are patterns which were sequentially inverted one of values of the arrival points at a time for every pattern, the 5th to 10th patterns are patterns which were sequentially inverted two of values of the arrival points at a time for every pattern, the 11th to 14th patterns are patterns which were sequentially inverted three of values of the arrival points at a time for every pattern. The 15th pattern is a pattern which all of values of the arrival points were inverted. This inverted pattern inputting is continued until it has become possible to specify the position of the fault, then such pattern inputting may be stopped.

In FIG. 5 again, the 0-th pattern is a pattern that an inconsistency was found, namely, a pattern that none of values of the arrival points was inverted. The 1st to 15th patterns are count-up inverted patterns of all possible combinations were sequentially inputted only with respect to the arrival points, with the I1 input terminal 301 as an LSB (least significant bit), the F1 scan path flip-flop 307 as the next bit, with the F2 scan path flip-flop 308 as next to the next bit, and with the F4 scan path flip-flop 310 as an MSB (most significant bit).

In principle, in case of the first embodiment of FIG. 1, to specify the fault position, variation either in the output values of the terminals or in the values to be taken into the flip-flops is observed and analyzed. In case of the second embodiment of FIG. 2, the fault can be analyzed based on the information on whether or not an abnormal current flows in the circuit.

Following is one exemplary procedure of analysis for locating or identifying the fault position exactly.

In the first embodiment of FIG. 1, if the fault to be analyzed is a so-called stuck-at fault, it can be located by a fault simulation with respect to the inverted patterns to be generated by the sequential-inverting-pattern generator 5. Such a fault simulation can be executed for faults that are defined only in a circuit surrounded by the inconsistency detection points and the arrival points.

Yet with the structure of the first embodiment, even if a normal value equal to the value to be generated at the fault position and also a value different from the normal value have been generated into the LSI circuit for every given pattern, it is impossible to detect the difference of value unless such a given pattern is propagated to the involved terminals or scan flip-flops. Whereas with the structure of the second embodiment, if the fault position has become to satisfy a condition such as to cause a current abnormality, it can be detected immediately as it is highly likely that the fault analysis can be accomplished either with less number of patterns or in much shorter time.

As is understood from the foregoing disclosure of the preferred embodiments, according to the LSI tester of the present invention, the path-analysis section can identify input terminals or flip-flops that can reach the output terminal or flip-flop where an inconsistency output is detected. And the sequential-inverting-pattern section can define the involved input terminals or flip-flops more specifically.

By generating patterns successively with respect to only the values of the specifically defined input terminals or flip-flops, it is possible to locate or point the fault position much precisely in a simpler manner.

Furthermore, the LSI tester of the invention employs selectively a method of comparing the same value of the output terminal as the conventional LSI tester in logical level or of measuring a current and comparing the measured current with the ordinary value. Therefore, the LSI tester of the invention, unlike the so-called EB (electron beam) tester, the LSI tester does not require any special mechanism utilizing electron beams.

In each of the foregoing embodiments, the DUT may be a logic LSI, VLSI (very-large-scale integrated circuit),or ULSI (ultra-large-scale integrated circuit), each of which includes a plurality of logic circuit elements.

It is thus apparent that the present invention should by no means be limited to the illustrated embodiments and various modifications and changes may be suggested without departing from the scope and spirit of the invention.

What is claimed is:

1. An LSI tester for use in analyzing a possible fault of an LSI, the LSI including a plurality of flip-flops interconnected via a plurality of wirings, the LSI tester comprising:

a test pattern generator for generating successive test patterns to be inputted to the LSI each as an input pattern value such as to flow in a designated signal flow path passing through a designated series of the flip-flops and also for generating successive reference patterns each having an expected output pattern value which is equivalent with its corresponding actual output pattern value to be outputted from the LSI when all of the flip-flops in said designated signal flow path are normal in function;

an output pattern comparator for comparing said output pattern value from the LSI with said expected output pattern value for each and every one of said successive test patterns;

path analysis means for reverse tracing said designated series of flip-flops along said designated signal flow path from one of the flip-flops where an inconsistency in pattern value has been detected by said output pattern comparator as an inconsistency detection point, based on circuit information of the LSI, and for identifying of the flip-flops in said designated signal flow path, which are firstly reachable flip-flops or external terminals from said inconsistency detection point as arrival points; and sequential-pattern-inverting means for sequentially inverting at least partly said pattern values of said successive test patterns one at a time with respect to said one flip-flop identified as said arrival point.

2. The LSI tester according to claim 1, wherein said input pattern value of each of said test patterns is a set of values corresponding one for each of the flip-flops in said designated signal flow path.

3. The LSI tester according to claim 2, wherein said set of values is logical binary signals each indicative of a logical state "1" or "0" of a corresponding one of the flip-flops.

4. The LSI tester according to claim 1, wherein said circuit information of the LSI is data stored in a circuit information file memory.

5. The LSI tester according to claim 4, wherein said circuit information file memory is a dedicated storage to be controlled by said computer.

6. The LSI tester according to claim 1, wherein the respective functions of said path analysis means, said test pattern generator and said sequential-pattern-inverting means are executed according to a program installed in a computer.

7. The LSI tester according to claim 6, wherein said circuit information file memory is a built-in part of said computer.

8. The LSI tester according to claim 1, wherein said sequential-pattern-inverting means includes communication means of a computer for controllably executing the function of said test pattern generator.

9. The LSI tester according to claim 1, further comprising power-supply-current measuring means for measuring a power supply operating current while said values of said successive test patterns to be inputted into the LSI from said test pattern generator are sequentially inverted by said sequential-pattern-inverting means.

10. The LSI tester according to claim 9, wherein the function of said power-supply-current measuring means is executed by a program installed in a computer.

11. An LSI tester for use in analyzing a possible fault of an LSI, the LSI including a plurality of external terminals interconnected via a plurality of wirings, the LSI tester comprising:

a test pattern generator for generating successive test patterns to be inputted to the LSI each as an input pattern value such as to flow in a designated signal flow path passing through a designated series of connections and also for generating successive reference patterns each having an expected output pattern value which is equivalent with its corresponding actual output pattern value to be outputted from the LSI when all of the external terminals in said designated signal flow path are normal in function;

an output pattern comparator for comparing said output pattern value from the LSI with said expected output pattern value for each and every one of said successive test patterns;

path analysis means for reverse tracing said designated series of the connections along said designated signal flow path from one of the external terminals where an inconsistency in pattern value has been detected by said output pattern comparator as an inconsistency detection point, based on circuit information of the LSI, and for identifying of all of the external terminals in said designated signal flow path, which are firstly reachable external terminals from said inconsistency detection point as arrival points; and sequential-pattern-inverting means for sequentially inverting at least partly said pattern values of said successive test patterns one at a time with respect to said one external terminal identified as said arrival point.

12. The LSI tester according to claim 11, wherein said input pattern value of each of said test patterns is a set of values corresponding one for each of the external terminals in said designated signal flow path.

13. The LSI tester according to claim 12, wherein said set of values is logical binary signals each indicative of a logical state "1" or "0" of a corresponding one of the external terminals.

14. The LSI tester according to claim 11, wherein said circuit information of the LSI is data stored in a circuit information file memory.

15. The LSI tester according to claim 14, wherein said circuit information file memory is a built-in part of said computer.

16. The LSI tester according to claim 14, wherein said circuit information file memory is a dedicated storage to be controlled by said computer.

17. The LSI tester according to claim 11, wherein the respective function of said path analysis means, said test pattern generator and said sequential-pattern-inverting means are executed according to a program installed in a computer.

18. The LSI tester according to claim 11, said sequential-pattern-inverting means includes communication means of a computer for controllably executing the function of said test pattern generator.

19. An LSI tester for use in a functional test of a logic LSI, the LSI including a plurality of logic circuit elements interconnected via a plurality of wirings, the LSI tester comprising:

a test pattern generator for generating successive test patterns to be inputted to the LSI each as a input pattern value such as to flow in a designated signal flow path passing through a designated series of connections and also for generating successive reference patterns each having an expected logical output pattern value which is equivalent with its corresponding actual output pattern value to be outputted from the LSI when all of the logic circuit elements in said designated signal flow path are normal in function;

an output pattern comparator for comparing said output pattern value from the LSI with said expected output pattern value for each and every one of said successive test patterns;

path analysis means for reverse tracing said designated series of the connections along said designated signal flow path from one of the logic circuit elements where an inconsistency in pattern value has been detected by said output pattern comparator as an inconsistency detection point, based on circuit information of the LSI, and for identifying of all of the logic circuit elements in said designated signal flow path, are firstly reachable logic circuit elements from said inconsistency detection point as arrival points; and sequential-pattern-inverting means for sequentially inverting at least partly said pattern values of said successive test patterns one at a time with respect to said one logic circuit elements identified as said arrival points.

20. The LSI tester according to claim 19, wherein said logic LSI is a very-large-scale integrated circuit or an ultra-large-scale integrated circuit.

* * * * *